(12) United States Patent
Chen

(10) Patent No.: US 9,007,499 B2
(45) Date of Patent: Apr. 14, 2015

(54) IMAGE SENSOR MODULE AND CAMERA MODULE USING SAME

(71) Applicant: Hon Hai Precision Industry Co., Ltd., New Taipei (TW)

(72) Inventor: Shin-Wen Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 52 days.

(21) Appl. No.: 13/726,653

(22) Filed: Dec. 26, 2012

(65) Prior Publication Data
US 2014/0055669 A1 Feb. 27, 2014

(30) Foreign Application Priority Data
Aug. 22, 2012 (TW) .............................. 101130372 A

(51) Int. Cl.
*H04N 3/14* (2006.01)
*H04N 5/335* (2011.01)
*H01L 27/146* (2006.01)
*H04N 5/225* (2006.01)

(52) U.S. Cl.
CPC ........ *H01L 27/14618* (2013.01); *H04N 5/2253* (2013.01); *H04N 5/2254* (2013.01)

(58) Field of Classification Search
USPC ......... 348/294–324; 250/208.1; 257/290–292
See application file for complete search history.

(56) References Cited

U.S. PATENT DOCUMENTS 7,391,002 B2 * 6/2008 Sato et al. .................. 250/208.1

* cited by examiner

*Primary Examiner* — Yogesh Aggarwal
(74) *Attorney, Agent, or Firm* — Novak Druce Connolly Bove + Quigg LLP

(57) ABSTRACT

An image sensor module includes a ceramic substrate, an image sensor, a conductive film, and a bottom plate. The ceramic substrate includes an upper surface, a lower surface opposite to the upper surface, a side surface connected between the upper surface and the lower surface. The ceramic substrate has a through hole through the upper and lower surfaces, a receiving recess on the lower surface, and an air hole on the side surface. The through hole communicates with the receiving recess, and the air hole communicates with the receiving recess. The image sensor is received in the receiving recess and is electrically connected to the ceramic substrate. The bottom plate is positioned on the lower surface and electrically connected to the ceramic substrate by the conductive film.

8 Claims, 4 Drawing Sheets

IMAGE SENSOR MODULE AND CAMERA MODULE USING SAME

BACKGROUND

1. Technical Field

The present disclosure relates to optical modules, and particularly, to an image sensor module and a camera module including the image sensor module.

2. Description of Related Art

Image sensor modules generally include a ceramic substrate, an image sensor, and a circuit board module. The image sensor is electrically connected on a lower surface of the ceramic substrate by a method of flip-chip package. The ceramic substrate is positioned on the circuit board module and electrically connected to the circuit board module by conductive glue. The image sensor is received between the circuit board module and the ceramic substrate. However, in testing, the image sensor module is subjected to heating and the conductive glue will generate gas. As such, the air pressure between the ceramic substrate and the circuit board module will increase and the ceramic substrate may be forced away from the circuit board module, resulting in a bad electrical connection.

Therefore, it is desirable to provide an image sensor module and a camera module, which can overcome the limitations described.

DETAILED DESCRIPTION

Embodiments of the disclosure will be described with reference to the drawings.

Figure 1:
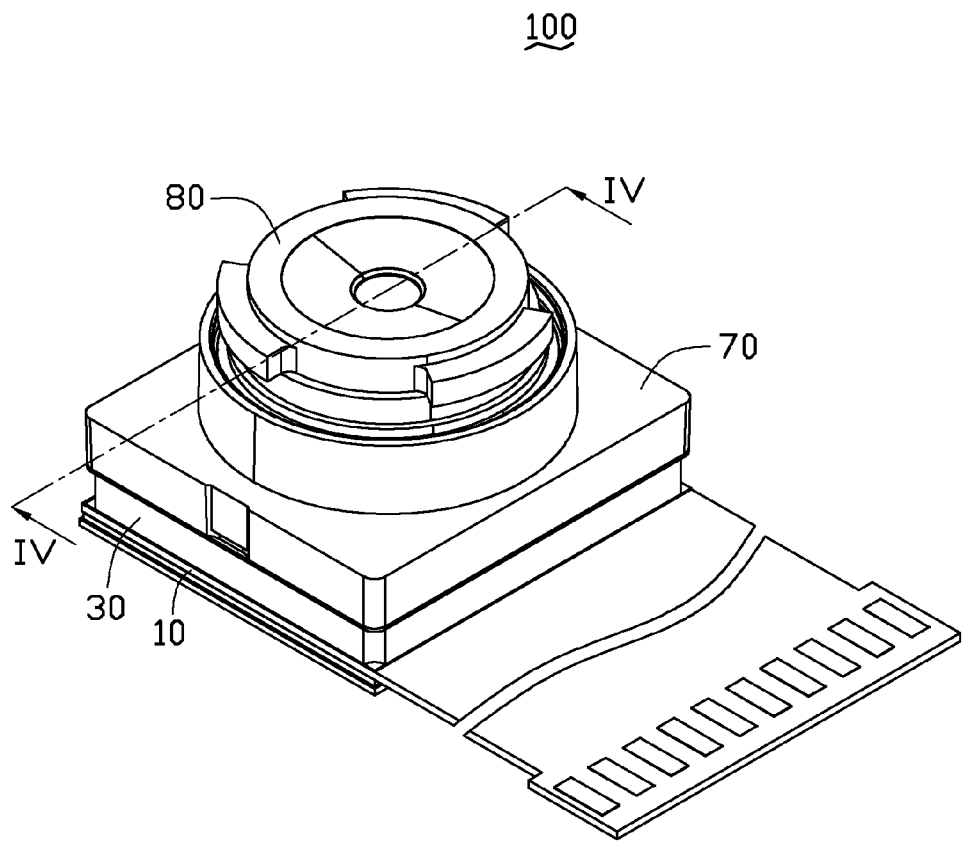
FIG. 1 is an isometric view of a camera module in accordance with an exemplary embodiment.
Figure 2:
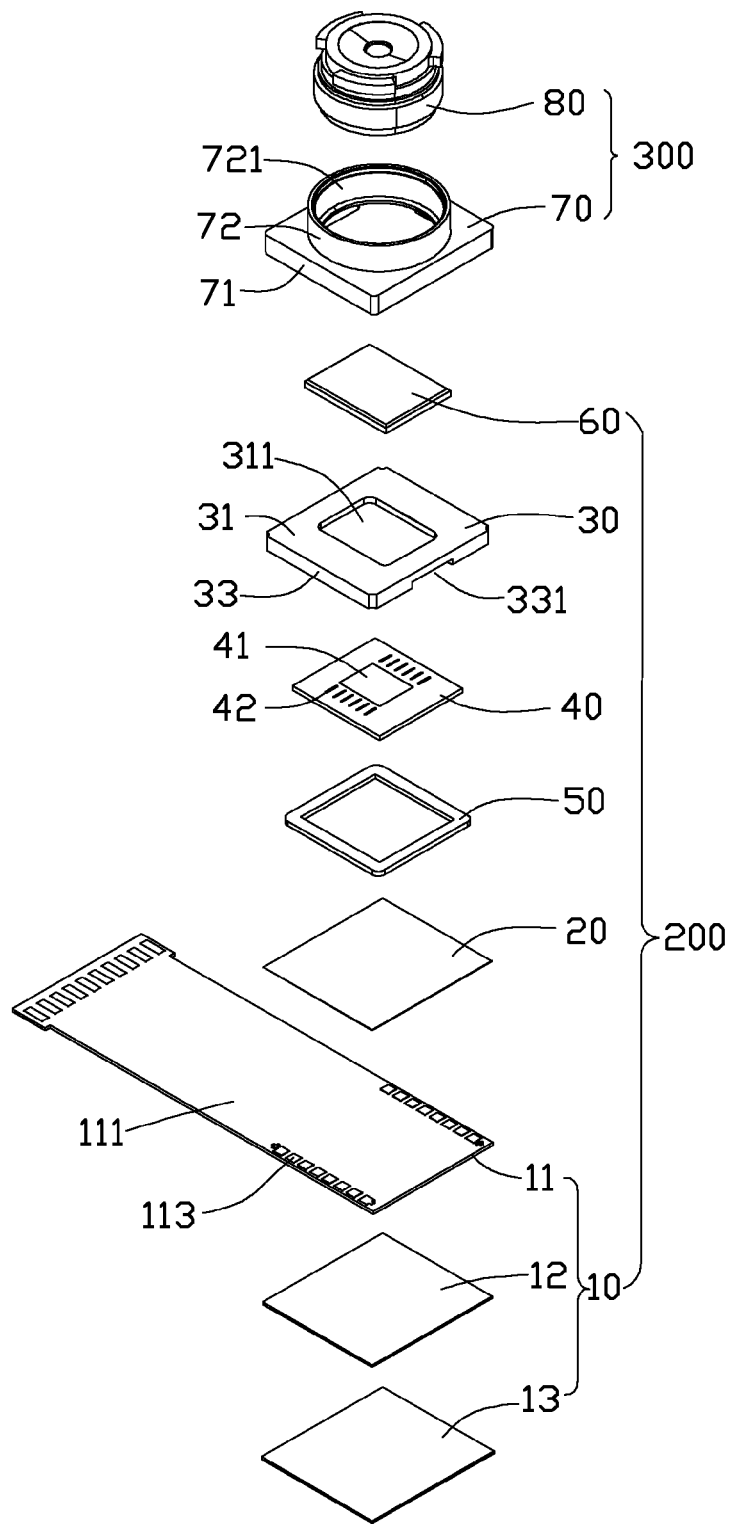
FIG. 2 is an isometric, exploded, and schematic view of the camera module of FIG. 1.
Figure 3:
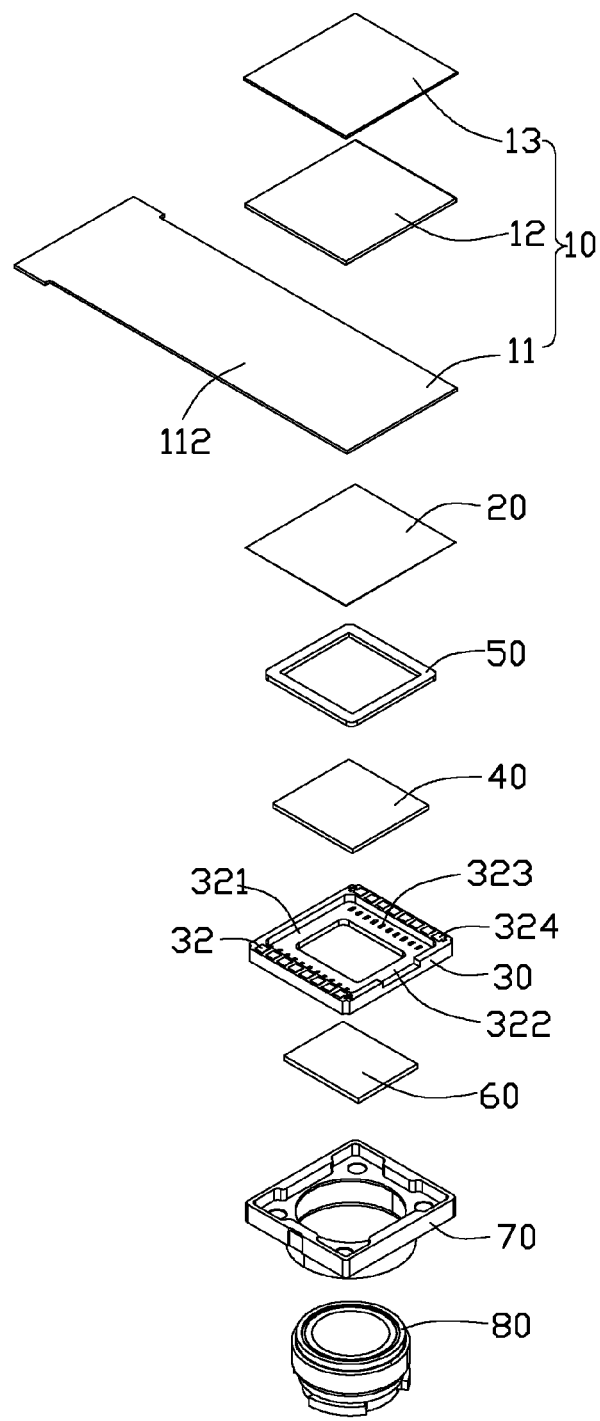
FIG. 3 is similar to FIG. 1, but viewed from another angle.

FIGS. 1-3 show a camera module 100 according to an exemplary embodiment. The camera module 100 includes an image sensor module 200 and a lens module 300 positioned on the image sensor module 200. The image sensor module 200 includes a bottom plate 10, a conductive film 20, a ceramic substrate 30, an image sensor 40, a filling body 50, and a filter 60. The lens module 300 includes a lens holder 70, and a lens unit 80.

The bottom plate 10 is rectangular and is an electrical circuit board. The bottom plate 10 includes a flexible printed circuit board (FPCB) 11, an adhesive layer 12, and a stiffening plate 13. The adhesive layer 12 is adhered between the FPCB 11 and the stiffening plate 13. The FPCB 11 includes a first surface 111 and a second surface 112 opposite to the first surface 111. A number of connecting pads 113 are formed on the first surface 111, generally adjacent to opposite edges of the FPCB 11. The stiffening plate 13 adheres to the second surface 112 of the FPCB 11. The mechanical strength of the FPCB 11 is effectively increased by adding the stiffening plate 13.

The conductive film 20 is an anisotropic conductive film, and is adhered on the first surface 111 of the FPCB 11. The conductive film 20 is electrically connected to the FPCB 11 along a direction perpendicular to the first surface 111 and is electrically disconnected to the FPCB 11 along a direction parallel with the first surface 111 when the conductive film 20 is subjected to a hot pressing process.

The ceramic substrate 30 includes an upper surface 31, a lower surface 32 opposite to the upper surface 31, and a side surface 33 connecting the upper surface 31 and the lower surface 32. The ceramic substrate 30 defines a through hole 311 through the upper surface 31 and the lower surface 32, a receiving recess 321 on the lower surface 32, and an air hole 331 on the side surface 33. The through hole 311 communicates with the receiving recess 321. The air hole 321 also communicates with the receiving recess 321, and passes all the way through the lower surface 32. The receiving recess 321 includes a connecting surface 322 parallel to the upper surface 31. A number of first pads 323 are formed on the connecting surface 322, and a number of second pads 324 are formed on the lower surface 32. The first pads 323 are connected to the second pads 324 by wires buried in the ceramic substrate 30.

The image sensor 40 includes an image surface 41 and a number of pins 42 adjacent to opposite edges of the image surface 41. The image sensor 40 converts light rays striking the image surface 41 into image signals in form of electric signals, and the image signals are output from the pins 42. In the embodiment, the image sensor 40 can be a complementary metal-oxide-semiconductor transistor (CMOS) sensor or a charge coupled device (CCD) sensor.

The filling body 50 functions as a frame, and is made of an opaque glue. The opaque glue is applied into to a mold and then is cured.

The filter 60 is rectangular, and is transparent, made of a material, such as glass. The filter 60 filters out infrared light from the light passing through.

Figure 4:
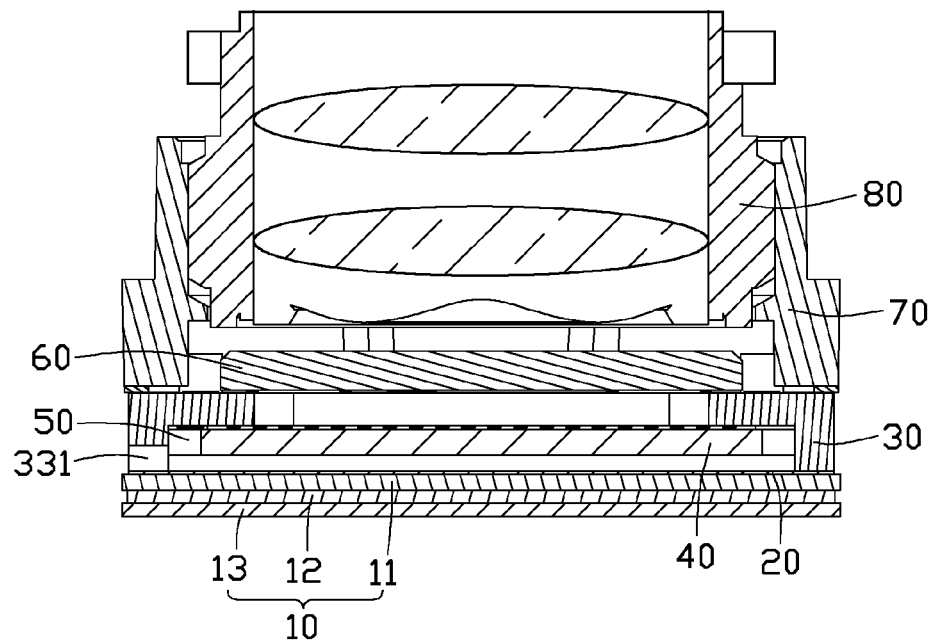
FIG. 4 is a cross-sectional view taken along a line IV-IV of FIG. 1.

FIG. 4 shows an assembling process of the image sensor module 200. The image sensor 20 is received in the receiving recess 321, and the image surface 41 faces the through hole 311. The pins 42 are electrically connected to the first pads 323. The filling body 50 is received in the receiving recess 321, and surrounds the image sensor 40. In the embodiment, the opaque glue is applied into the receiving recess 321 and surrounds the image sensor 40, and then the opaque glue is cured. The lower surface 32 of the ceramic substrate 30 is supported on the first surface 111 of the FPCB 11, the second pads 324 are electrically connected to the connecting pads 113 by the conductive film 20. The filter 60 is positioned on the upper surface 31 of the ceramic substrate 30, and the through hole 311 is covered by the filter 60.

The lens holder 70 includes a seat 71 and a receiving portion 72 positioned on one end of the seat 71. The seat 71 is hollow shaped. The receiving portion 72 defines a receiving hole 721 communicating with the seat 71. The lens unit 80 is received in the receiving hole 721, and includes at least one lens (not shown) and a barrel receiving the at least one lens.

In the process of assembling the camera module 100, the lens holder 70 receiving the lens unit 80 is positioned on the upper surface 31 of the ceramic substrate 30. The seat 61 surrounds the through hole 311. The filter 60 is received in the seat 71. The optical axis of the lens unit 80 coincides with the optical axis of the image sensor 40.

In use, the image sensor 40 converts the light rays penetrating the lens module 300 into image signals. The image signals are output to the FPCB 11 through the pins 42, the first pads 323, the second pads 324, and the connecting pads 113. As the stiffening plate 13 is added on the FPCB 11, the mechanical strength of the FPCB 11 and the conductive film 20 are effectively increased, and the conductive film 20 will not block or seal the air hole 331 of the ceramic substrate 30.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An image sensor module, comprising:
a ceramic substrate comprising an upper surface, a lower surface opposite to the upper surface, a side surface connected between the upper surface and the lower surface; the ceramic substrate defining a through hole through the upper and lower surfaces, a receiving recess on the lower surface, and an air hole on the side surface; the through hole communicating with the receiving recess, the air hole communicating with the receiving recess;
an image sensor received in the receiving recess and electrically connected to the ceramic substrate;
a conductive film; and
a bottom plate positioned on the lower surface of the ceramic substrate and electrically connected to the ceramic substrate by the conductive film, the bottom plate comprising a flexible printed circuit board (FPCB), an adhesive layer, and a stiffening plate, and the adhesive layer adhered between the FPCB and the stiffening plate.

2. The image sensor module of claim 1, wherein the receiving recess comprises a connecting surface parallel with the upper surface, a plurality of first pads positioned on the connecting surface, and a plurality of second pads positioned on the lower surface; the first pads are correspondingly connected to the second pads.

3. The image sensor module of claim 2, wherein the image sensor comprises an image surface and a plurality of pins adjacent to the image surface, the pins are electrically connected to the first pads.

4. The image sensor module of claim 1, wherein the air hole passes all the way through the lower surface.

5. A camera module, comprising:
an image sensor module, comprising:
a ceramic substrate comprising an upper surface, a lower surface opposite to the upper surface, a side surface connected between the upper surface and the lower surface; the ceramic substrate defining a through hole through the upper and lower surfaces, a receiving recess on the lower surface, and an air hole on the side surface; the through hole communicating with the receiving recess, the air hole communicating with the receiving recess;
an image sensor received in the receiving recess and electrically connected to the ceramic substrate;
a conductive film; and
a bottom plate positioned on the lower surface of the ceramic substrate and electrically connected to the ceramic substrate by the conductive film, the bottom plate comprising a flexible printed circuit board (FPCB), an adhesive layer, and a stiffening plate, and the adhesive layer adhered between the FPCB and the stiffening plate; and
a lens module, comprising:
a lens holder positioned on the upper surface of the ceramic substrate; and
a lens unit received in the lens holder.

6. The camera module of claim 5, wherein the receiving recess comprises a connecting surface parallel with the upper surface, a plurality of first pads positioned on the connecting surface, and a plurality of second pads positioned on the lower surface; the first pads are correspondingly connected to the second pads.

7. The camera module of claim 6, wherein the image sensor comprises an image surface and a plurality of pins adjacent to the image surface, the pins are electrically connected to the first pads.

8. The camera module of claim 5, wherein the air hole passes all the way through the lower surface.

* * * * *